United States Patent [19]
Sakamoto

[11] Patent Number: 5,623,210
[45] Date of Patent: Apr. 22, 1997

[54] CURRENT DETECTOR FOR DETECTING BATTERY CHARGE REMAINING

[75] Inventor: Norinobu Sakamoto, Ora-gun, Japan

[73] Assignee: Sanyo Electric Co., Ltd., Osaka, Japan

[21] Appl. No.: 403,309

[22] Filed: Mar. 8, 1995

[30] Foreign Application Priority Data

Mar. 23, 1994 [JP] Japan .................................. 6-051877

[51] Int. Cl.$^6$ .......................................................... H02J 7/00
[52] U.S. Cl. ................... 324/426; 320/40; 320/30
[58] Field of Search ........................ 320/40, 9, 14; 324/426

[56] References Cited

U.S. PATENT DOCUMENTS 5,307,001  4/1994  Heavey ........................ 320/30

Primary Examiner—Kenneth A. Wieder
Assistant Examiner—Barry C. Bowser
Attorney, Agent, or Firm—Loeb & Loeb LLP

[57] ABSTRACT

A current-voltage convertor 32 respectively generates positive and negative voltages Xa when a battery 20 is being charged and discharged. A voltage synthesizer 34 adds a prescribed positive voltage to the voltage Xa, and always generates a positive sample voltage Xs. This sample voltage Xs and prescribed reference voltages X1, X2 are compared by means of two differential amplifiers 40, 42 to obtain signals V1, V2 for the currents being charged and discharged. Then, these signals are supplied to a microcomputer 44.

13 Claims, 3 Drawing Sheets

CURRENT DETECTOR FOR DETECTING BATTERY CHARGE REMAINING

BACKGROUND OF THE INVENTION

1. Field of the Invention

This invention relates to a battery charge remaining detector for detecting charged and discharged currents of a battery in order to detect a battery charge remaining.

2. Description of the Prior Art

Battery-driven equipment, e.g. a notebook type personal computer, is commonly used, and a rechargeable battery is used as a power source therefor. In such equipment, how long it can be used without recharging can be known when its battery charge remaining is indicated. Therefore, it is known that some equipment can indicate a battery charge remaining.

To indicate a battery charge remaining, it is first necessary to measure the battery charge remaining. For measuring the battery charge remaining, certain methods, such as the measurement of a battery voltage and the integration of charged and discharged quantities, are known. A method for measuring a battery voltage is easy, but a battery such as a nickel-hydrogen battery does not indicate a change in its voltage unless its remaining capacity is lowered substantially. Therefore, its remaining capacity cannot be measured accurately. There is also a problem that a temperature change affects the battery voltage, making it impossible to accurately measure the remaining capacity.

On the other hand, a discharged quantity of a battery can be relatively easily totaled up because the discharged quantity can be measured relatively accurately in view of the charged and discharged currents after full charging, and a circuit for measuring is not so complex. Therefore, this totalization of the discharged quantity is often used for measuring the battery charge remaining.

However, in the above totalization of the charged and discharged quantities, a current flows in opposite directions when being charged and discharged. Consequently, the detection of the charged and discharged currents requires the following measures:

(i) a power source which outputs a negative voltage is provided to enable an input voltage area of an amplification circuit to be expanded in the negative direction, or (ii) current detecting elements for detecting currents which flow in opposite directions are disposed to enable the detection of the charged and discharged currents by passing a current through either of the current detecting elements according to charged and discharged states by switching a changeover switch.

Thus, the above method has a disadvantage that a circuit for detecting the charged and discharged currents becomes complex.

Battery-driven notebook type personal computers are particularly required to have a lower number of parts because they are produced to be small, lightweight and inexpensive.

On the other hand, the continuously usable time of such equipment has been extended thanks to power-saving circuits and high-performance batteries. Accordingly, it has become necessary for a battery charge remaining to be detected very accurately. Specifically, when the continuous use was limited to about one to two hours after full charging, an error in detecting a battery charge remaining did not have a significant impact. However, when the continuous use can be extended up to seven or eight hours, an error of one to two hours has a large effect.

SUMMARY OF THE INVENTION

In view of the above circumstances, this invention has been completed and aims to provide a current detector for detecting a battery charge remaining, which can satisfy two conflicting objectives: reducing the number of parts and providing high performance.

The current detector for detecting a battery charge remaining according to this invention is a current detector for detecting a battery charge remaining for detecting charged and discharged currents of a battery which comprises:

a current-voltage convertor which is disposed on the negative electrode side of the battery and outputs a value of a current passing through the battery as an output voltage, a voltage synthesizer which adds a predetermined positive voltage to the output voltage of the current-voltage convertor to output a sample voltage, and a current signal generator which generates a signal for the charged and discharged currents of the battery on the basis of the above sample voltage.

Thus, the addition of the predetermined positive voltage by the voltage synthesizer causes the obtained sample voltage to be a positive voltage when charging and discharging. Also, the charged and discharged currents can be detected based on the voltage sampled by a relatively simple circuit.

The above current-voltage convertor includes of a current detecting resistor disposed between the negative electrode of the battery and ground, and the output voltage is outputted From the top end of the current detecting resistor.

Thus, the current passing through the battery can be converted into the output voltage.

The above voltage synthesizer includes of at least two potential dividing resistors connected in series between the top end of the current detecting resistor and the output of a constant-voltage power source, and the sample voltage is outputted from a connection point of the potential dividing resistors.

Thus, the sample voltage which has a predetermined positive voltage added to the connection point of the potential dividing resistors can be obtained.

The above constant-voltage power source preferably receives the output from the above battery and outputs a constant voltage which is lower than the output voltage of the above battery.

Thus, a certain voltage can be stably added by the voltage synthesizer.

The above current detector further has a reference voltage generator for generating a predetermined reference voltage and a comparator for comparing the reference voltage and the sample voltage.

The current signal generator generates the signal for the above battery charged and discharged currents according to the compared results obtained by the above comparator.

Thus, the signal corresponding to the charged and discharged currents can be obtained according to a difference from the reference voltage. Particularly, when two comparators are disposed to compare separately when charging and discharging, signals for the compared results substantially in proportion to the charged and discharged currents can be obtained.

The above comparator has at least two stages of operational amplifiers. The first stage operational amplifier receives one of the input signals with high impedance state, and the second stage operational amplifier compares the reference voltage and the signal inputted by the first stage operational amplifier and amplified.

Thus, comparison can be made stably.

The reference voltage generator has a first reference voltage generating circuit for generating a first reference voltage for detecting the discharged current, and a second reference voltage generating circuit for generating a second reference voltage for detecting the charged current.

The comparator has a first comparator for comparing the sample voltage and the first reference voltage for detecting the discharged current, and a second comparator for comparing the sample voltage and the second reference voltage for detecting the charged current.

The above first and second comparators output signals for the discharged current and the charged current respectively.

Thus, a predetermined offset can be given to the output from the comparator. Therefore, even when the parts are of uneven quality and the sample voltage when the battery current of 0A is deviated, the two comparators can obtain positive outputs. Also, based on the compared result, a microcomputer can accurately detect the charged and discharged currents of a battery.

The first reference voltage is preferably set to be higher than the second reference voltage.

Also, the first reference voltage is preferably set to be higher than the sample voltage when the above discharged currents are zero, and the second reference voltage to be lower than the sample voltage when the above charged currents are zero.

Thus, even when the reference voltages are not uniform due to errors in resistance values of the circuit parts, the compared result of the comparator can be prevented from becoming negative.

DETAILED DESCRIPTION OF THE PREFERRED EMBODIMENT

Figure 1:
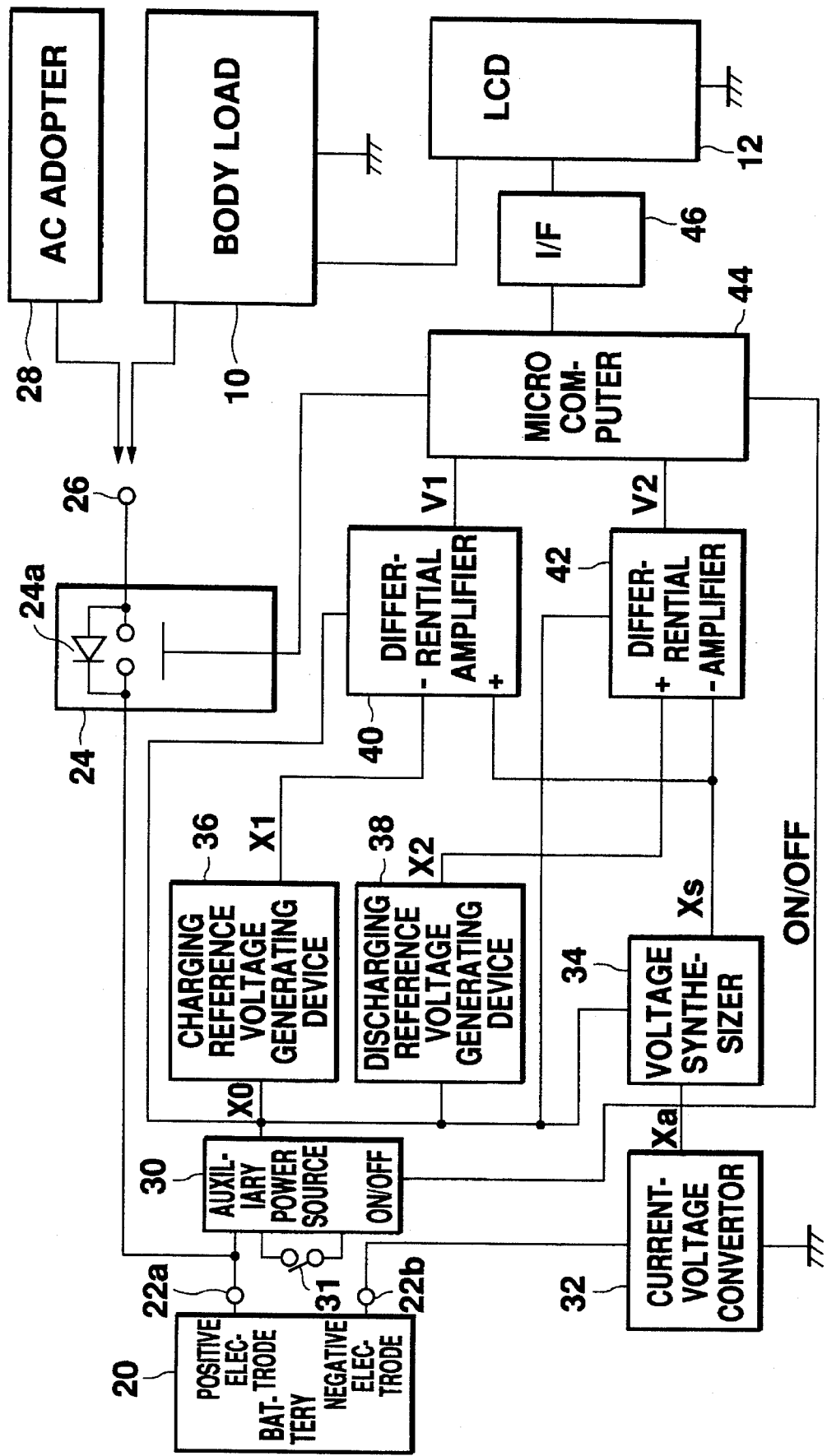
FIG. 1 is a block diagram showing the overall configuration of one embodiment.

One embodiment of this invention will be described with reference to the attached drawings. FIG. 1 is a block diagram showing the overall configuration of one embodiment, in which a body load 10 includes various circuits used to carry out various operations in a notebook type personal computer. An LCD (liquid crystal display) 12 is connected to the body load 10 to show various images.

A battery 20 is a rechargeable nickel-hydrogen battery (may be a nickel-cadmium battery or other types) whose positive electrode is connected to a contact 22a and negative electrode to a contact 22b. A contact 26 is connected to the contact 22a via a switch 24 and is also connected to the body load 10 or an AC adopter 28.

In a state where the body load 10 is connected to the contact 26, turning on the switch 24 supplies the power of the battery 20 to the body load 10. On the other hand, the AC adapter 28 rectifies a commercial 100 V d.c. current to output a prescribed charging current (d.c. current), and connecting the AC adopter 28 to the contact 26 allows recharging of the battery 20.

An auxiliary power source 80 is connected to the positive electrode of the battery 20 via the contact 22a. The auxiliary power source 80 outputs a prescribed constant voltage X0, e.g. it outputs a constant voltage of 5 V from the 9 V battery 20. A manual switch 81 is connected to the auxiliary power source 80, so that a signal according to the turning on or off of the switch 81 can be outputted from an ON/OFF terminal.

The negative electrode 22b of the battery 20 is connected to ground via a current-voltage convertor 82. The current-voltage convertor 82 converts a current passing therethrough to a voltage value and consists of, for example, a resistor R1, for detecting a current, having a predetermined low resistance value. Therefore, when the body load 10 operates, a current flows from the positive electrode of the battery 20 to the body load 10, to ground, to the current-voltage convertor 32, and to the negative electrode of the battery 20. On the other hand, when recharging, a current from the AC adapter 28 flows to the ground via the battery 20 and the current-voltage convertor 32.

Therefore, the output (upper end of the current detecting resistor R1 in FIG. 3) of the current-voltage convertor 32 has a positive or negative voltage Xa generated according to the current passing through the battery 20. Namely, when it is assumed that a resistance value of the current detecting resistor is R1 and the charged and discharged current values of the battery 20 are I, a voltage of I*R1 or –I*R1 is generated in the current detecting resistor R1 when charging or discharging, and it is outputted from the current-voltage convertor 32.

The output of the current-voltage convertor 32 is connected to one terminal of a voltage synthesizer 34, an other terminal of which is connected to the output of the auxiliary power source 30. The voltage synthesizer 34 adds a prescribed voltage, which is larger than a maximum negative voltage Xa, to the output of the current-voltage convertor 32, and consists of, for example, a pair of potential dividing resistors R2, R3 (resistance values are R2 and R3) connected in series, and a sampling voltage Xs is outputted from a connection point of the potential dividing resistors R2, R3.

This sampling voltage Xs is expressed as follows when charging and discharging respectively:

Xs1=(X0–I*R1)*R3/(R2+R3)+I*R1, and

Xs2=(X0+I*R1)*R3/(R2+R3)–I*R1 where, X0 is an output voltage of the auxiliary power source 30. When it is assumed that a voltage when the current I=0 is Xs0, this voltage Xs0 is represented as follows: Xs0= X0*R3/(R2+R3).

The output of the auxiliary power source 30 is connected to a charging reference voltage generating device 36 and a discharging reference voltage generating device 38. The charging reference voltage generating device 36 and the discharging reference voltage generating device 38 can be respectively configured by predetermined potential dividing resistors and can generate prescribed output voltages X1, X2 respectively. The voltages X1, X2 are substantially equal to the output voltage of the voltage synthesizer 34 when the battery current is 0A and are set to be X1<Xs0 and X2>Xs0.

The output voltage X1 of the charging reference voltage generating device 36 is inputted to an inverting input terminal of a differential amplifier 40, and the output voltage Xs of the voltage synthesizer 34 is inputted to a non-inverting input terminal of the differential amplifier 40. Therefore, the differential amplifier 40 outputs a signal V1 for an increased value of output voltage Xs of the voltage synthesizer 34 when charging. On the other hand, the output voltage X2 of the discharging reference voltage generating device 38 is inputted to an inverting input terminal of a differential amplifier 42, and the output voltage Xs of the voltage synthesizer 34 is inputted to a non-inverting input terminal of the differential amplifier 42. Therefore, the differential amplifier 42 outputs a signal V2 for a decreased value of output voltage Xs of the voltage synthesizer 34 when discharging.

In the above case, the output voltages X1, X2 of the charging reference voltage generating device 36 and the discharging reference voltage generating device 38 have been set to be X1<Xs0 and X2>Xs0, so that the input voltage values of the two input terminals of the differential amplifiers 40, 42 are not inverted even when the voltage value at each point is varied due to the uneven quality of parts such as resistors.

Figure 2:
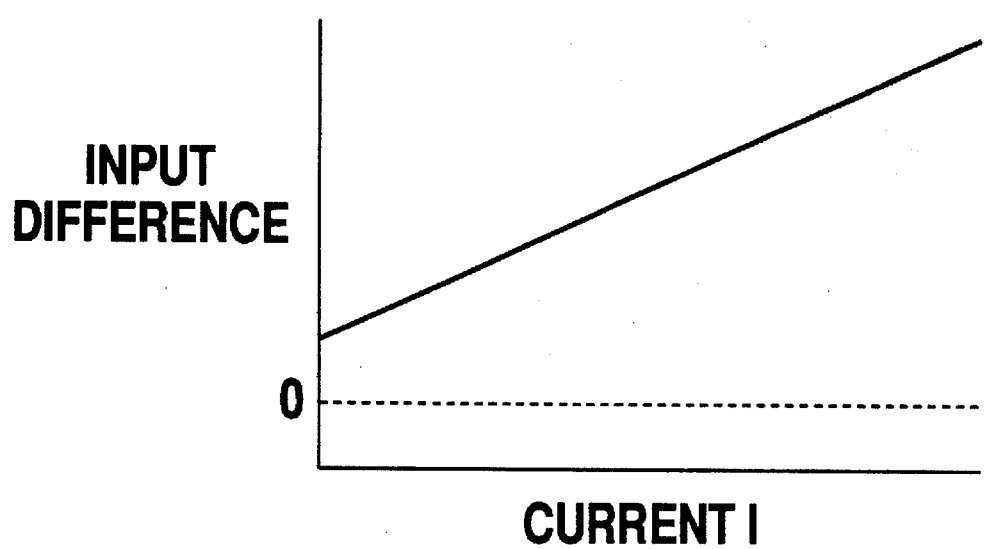
FIG. 2 is a characteristic view showing a state where an offset is applied to the comparator.

More specifically, when a current of the battery 20 is 0A, determining the same voltage as the output Xs0 of the voltage synthesizer 34 to be a reference voltage to be inputted to the non-inverting or inverting input terminal of the two differential amplifiers 40, 42 should make it possible to provide a positive difference value from the two differential amplifiers 40, 42 when charging and discharging. In reality, however, the parts are not uniform in quality, and the output Xs from the voltage synthesizer 34 also varies when the current of the battery 20 is 0A. Therefore, this embodiment has the different reference voltages X1, X2 as described above to generate an offset for comparison in the differential amplifiers 40, 42. Thus, a positive output can definitely be obtained even when the current of the battery 20 is 0A, as shown in FIG. 2 for example.

The outputs V1, V2 of the differential amplifiers 40, 42 are supplied to two terminals of a microcomputer 44. The microcomputer 44 carries out A/D conversion of the voltage values supplied into the two terminals and recognizes the charged current or discharged current of the battery 20 from the obtained values. The recognized current values are added up to calculate the remaining capacity of the battery 20.

The LCD 12 is connected to the microcomputer 44 via an interface 46 and indicates the battery charge remaining. This indication may be made when a certain key is pressed, constantly made at a certain position, or may be any other style. It is preferable to issue an alarm when the battery charge remaining is lowered. Although it is not shown, the LCD 12 is also powered by the battery 20 in the same way as the body load 10.

As described above, in this embodiment, the voltage synthesizer 34 is used to change all positive or negative sample voltage signals, which have been obtained by the current-voltage convertor 32 for the current of the battery 20, to positive signals. Therefore, both the charged and discharged currents of the battery 20 can be detected by a simple circuit.

Further, the sample voltage obtained in the voltage synthesizer 34 is compared with different reference voltages X1, X2 in the two differential amplifiers 40, 42. A positive value can definitely be obtained in one of the differential amplifiers 40, 42, and the charged and discharged currents can be accurately detected by the microcomputer 44.

The microcomputer 44 turns the switch 24 on/off according to the manual switch 31 which is turned on/off.

Figure 3:
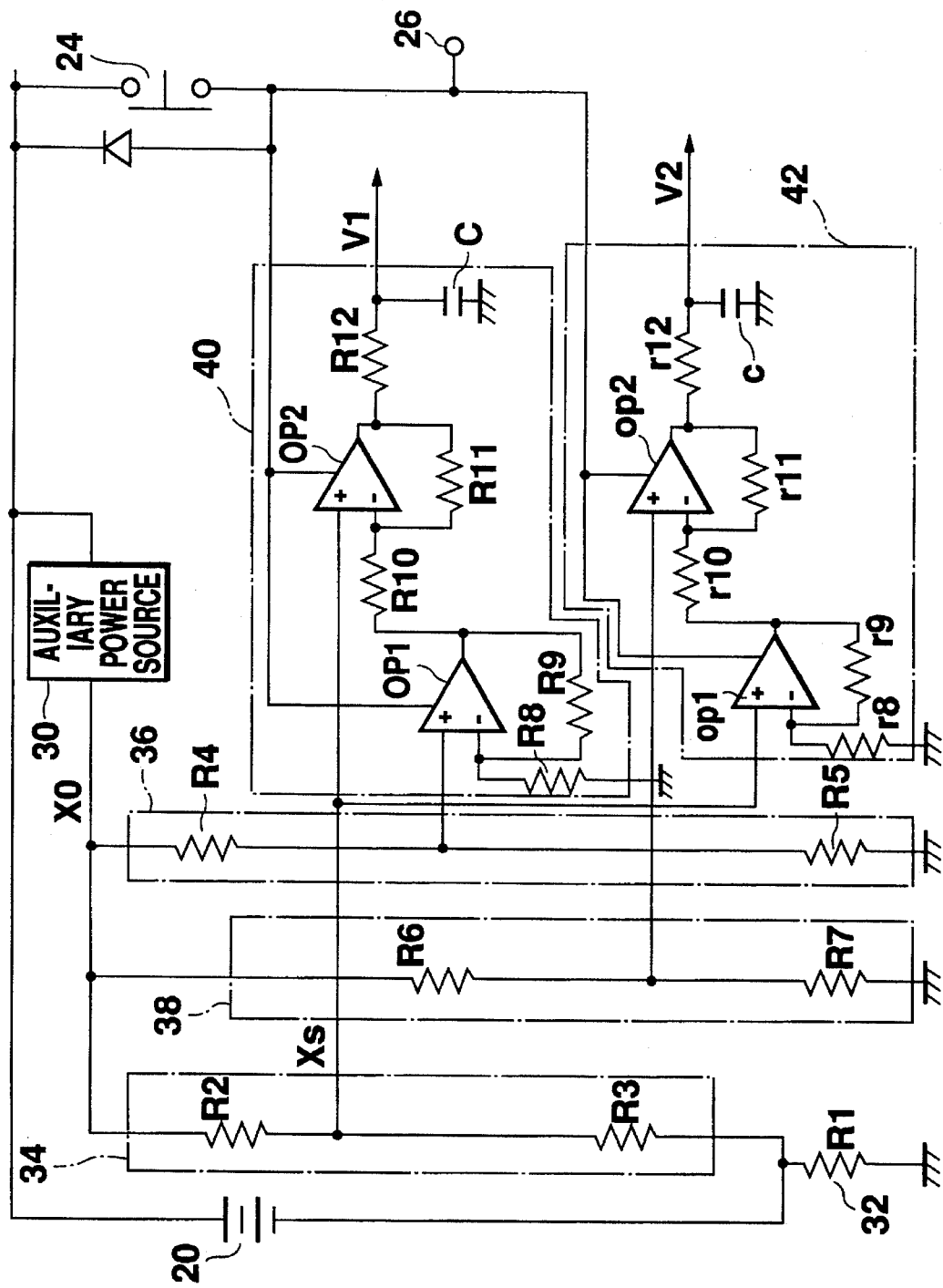
FIG. 3 is a circuit diagram showing the essential section of one embodiment.

FIG. 3 shows a circuit diagram of the current detecting section of this embodiment. The current-voltage convertor 32 consists of the single resistor R1. This resistor R1, through which the charged and discharged currents flow, is set to a as small value as possible within a range where a significant voltage signal can be obtained, namely 50 m ohms. The voltage synthesizer 34 which consists of the resistors R2, R3 connected in series is positioned above and connected to the resistor R1.

The upper side of the resistor R2 is connected to X0 (5 V in this case) which is the output of the auxiliary power source 30. These resistors R2, R3 have relatively high resistance values, e.g., 100 k ohms and 5.1 k ohms respectively, so that power consumption is lowered. In this case, the output voltage Xs0 becomes 243 mV when the battery 20 has a current of 0A.

The charging reference voltage generating device 36 consists of resistors R4, R5 connected in series which are substantially the same as those of the voltage synthesizer 34 disposed between the output 5 V of the auxiliary power source 30 and ground. The resistors R4, R5 are set to, for example, 100 k ohms and 4.7 k ohms respectively, so that the resistor R5 is slightly lower than the resistor R3 of the voltage synthesizer 34. Therefore, the output voltage X1 of the charging reference voltage generating device 36 is 225 mV which is little lower than the output voltage Xs0 of the voltage synthesizer 34 when the battery 20 has a current of 0A.

The discharging reference voltage generating device 38 has substantially the same configuration as the charging reference voltage generating device 36, and consists of resistors R6, R7 connected in series. The resistors R6, R7 are set, for example, to 100 k ohms and 5.6 k ohms respectively. Thus, the resistor 7 has a value similar to, but slightly higher than, that of the resistor R3 of the voltage synthesizer 34. Therefore, the output voltage X2 of the discharging reference voltage generating device 38 becomes 265 mV which is slightly higher than the output voltage Xs0 of the voltage synthesizer 34 when the battery 20 has a current of 0A.

The output Xs from the voltage synthesizer 34 and the output X1 from the charging reference voltage generating device 36 are entered into the differential amplifier 40, and the output Xs from the voltage synthesizer 34 and the output X2 from the discharging reference voltage generating device 38 are entered into the differential amplifier 42. These differential amplifiers 40, 42 each consist of a circuit having two operational amplifiers connected in two stages.

More specifically, the differential amplifier 40 has an operational amplifier OP1 having the voltage X1 entered into a non-inverting input terminal and another operational amplifier OP2 having the voltage Xs entered into a non-inverting input terminal. An inverting input terminal of the operational amplifier OP1 is connected to ground through a resistor R8, and the output terminal and the inverting input terminal are connected via a feedback resistor R9. The resistors R8 and R9 are set to 100 k ohms and 3.6 k ohms respectively.

The input terminal of the operational amplifier OP1 has a voltage of 225 mV, so that the operational amplifier outputs 233 mV. This output of the operational amplifier OP1 is entered into the inverting input terminal of the operational amplifier OP2 via a resistor R10. The output terminal and the inverting input terminal of the operational amplifier OP2 are connected via a feedback resistor R11. The input terminal of the operational amplifier OP2 has the voltage Xs, which becomes 243 mV when the battery current is 0A, 385 mV when the charged current is 3A, and 52 mV when the discharged current is 4A.

Consequently, the operational amplifier OP2 outputs 521 mV when the battery current is 0A, 4607 mV when the charged current is 3A, and 0 mV when the discharged current is 4A. Thus, the voltage signal V1 corresponding to the charged current of the battery 20 is outputted from the differential amplifier 40. The output from the operational amplifier OP2 is made via a resistor 12, and the output terminal of the resistor 12 is connected to a capacitor C whose other terminal is grounded. The resistor R12 and the capacitor C remove the small variations in the output voltage, and the voltage signal V1 is supplied to the microcomputer 44.

The differential amplifier 42 has basically the same configuration as the differential amplifier 40, so that the operational amplifiers OP1, OP2 of the differential amplifier 40 correspond to op1, op2 of the differential amplifier 42 and the resistors R8 to R12 correspond to r8 to r12. In the differential amplifier 42, the non-inverting input terminal of the operational amplifier op1 receives the voltage Xs, and the non-inverting input terminal of the operational amplifier op2 receives the voltage X2. The resistors r9, r10 have their resistance values set to 5.1 k ohms.

Accordingly, the input of the operational amplifier op1 has the voltage Xs, and the input of the operational amplifier op2 has a voltage of 265 V. The operational amplifier op1 outputs 255 mV when the battery current is 0A, 405 mV when the charged current is 3A, and 55 mV when the discharged current is 4A. The operational amplifier op2 outputs 461 mV when the battery current is 0A, 0 mV when the charged current is and 4383 mV when the discharged current is 4A. Thus, the voltage signal V2 corresponding to the discharged current of the battery 20 is outputted from the differential amplifier 42.

As described above, the circuit of the above embodiment can provide a stable operation when charging and discharging, and allows the microcomputer 44 to accurately detect the current of the battery 20. The above embodiment uses the two operational amplifiers in the differential amplifiers 40, 42 respectively, so that the circuit drift can be reduced while these differential amplifiers can make the input impedance sufficiently large. Therefore, the differential amplifiers 40, 42 may also be of any other type.

The battery 20 generally has different maximum charged and discharged currents as described above. Therefore, comparison can be made by suitably generating two reference voltages and comparing them separately as in the above embodiment.

What is claimed is:

1. A current detector, for detecting a battery charge remaining by detecting charged and discharged currents of a battery, comprising:

a current-voltage convertor which is serially connected to the negative electrode side of the battery, and outputs a value of a current passing through the battery during charging and discharging of the battery as an output voltage signal, a voltage synthesizer which adds a predetermined positive voltage to the output voltage or the current-voltage convertor to output a sample voltage, and a current signal generator which generates a signal for the charged and discharged currents of the battery on the basis of said sample voltage.

2. A current detector according to claim 1, wherein said current-voltage convertor includes a current detecting resistor disposed between the negative electrode of the battery and ground, and the output voltage is outputted from the end of said current detecting resistor connected to said negative electrode.

3. A current detector according to claim 1, wherein said voltage synthesizer includes at least two potential dividing resistors connected in series between the end of the current detecting resistor connected to said negative electrode and the output of a constant-voltage power source, and the sample voltage is outputted from a connection point of said potential dividing resistors.

4. A current detector according to claim 3, wherein said constant-voltage power source receives the output from said battery and outputs a constant voltage which is lower than the output voltage of said battery.

5. A current detector according to claim 3, further comprising:

a reference voltage generator for generating a predetermined reference voltage, and a comparator for comparing the reference voltage and the sample voltage, wherein said current signal generator generates a signal for said battery charged and discharged currents according to the results compared by said comparator.

6. A current detector according to claim 5, wherein said comparator has at least two operational amplifiers, wherein the first operational amplifier receives one of the input signals with high impedance state, and the second operational amplifier compares said reference voltage and the signal inputted by said first operational amplifier and amplifies the output signal compared.

7. A current detector according to claim 5, wherein said reference voltage generator has a first reference voltage generating circuit for generating a first reference voltage for detecting a discharged current, and a second reference voltage generating circuit for generating a second reference voltage for detecting a charged current, wherein said comparator has a first comparator for comparing said sample voltage and said first reference voltage for detecting the discharged current, and a second comparator for comparing said sample voltage and said second reference voltage for detecting the charged current, and said first and second comparators output signals for the discharged current and the charged current respectively.

8. A current detector according to claim 7, wherein said first reference voltage is set to be higher than said second reference voltage.

9. A current detector according to claim 8, wherein said first reference voltage is set to be higher than the sample voltage when said charged and discharged currents are zero, and said second reference voltage is set to be lower than the sample voltage when said charged and discharged currents are zero.

10. A current detector according to claim 1, wherein said current-voltage convertor consists of a resistor.

11. A current detector according to claim 10, wherein said resistor has a first side connected to the negative electrode side of the battery.

12. A current detector according to claim 11, wherein said resistor has a second side connected to ground.

13. A current detector according to claim 12, wherein the output voltage signal from said current-voltage convertor is constituted by the voltage at the first side of said resistor.

* * * * *